United States Patent
Knecht et al.

[11] Patent Number: 5,608,359
[45] Date of Patent: Mar. 4, 1997

[54] FUNCTION-DIFFERENTIATED TEMPERATURE COMPENSATED CRYSTAL OSCILLATOR AND METHOD OF PRODUCING THE SAME

[75] Inventors: Thomas A. Knecht, Algonquin; Tandy M. Watkins, Hoffman Estates, both of Ill.

[73] Assignee: Motorola, Inc., Schaumburg, Ill.

[21] Appl. No.: 540,427

[22] Filed: Oct. 10, 1995

[51] Int. Cl.⁶ .................. H01L 23/495; H03B 5/36; H05K 5/02; H05K 7/18
[52] U.S. Cl. .................. 331/68; 331/108 D; 331/158; 331/177 R; 29/25.35; 257/666; 361/813
[58] Field of Search .................. 331/34, 68, 74, 331/108 C, 108 D, 158, 177 R, 187; 361/813; 257/666; 29/25.35; 310/311, 318, 340, 344, 348

[56] References Cited

U.S. PATENT DOCUMENTS

| | | | |
|---|---|---|---|
| 2,613,252 | 10/1952 | Heibel | 361/813 |
| 4,837,184 | 6/1989 | Lin et al. | |
| 4,916,413 | 4/1990 | Nakayama et al. | 331/68 |
| 5,147,815 | 9/1992 | Castro | |
| 5,184,207 | 2/1993 | Cain | |
| 5,229,640 | 7/1993 | Pak | 331/68 X |
| 5,243,498 | 9/1993 | Scofield | |
| 5,250,841 | 10/1993 | Sloan et al. | |
| 5,297,008 | 3/1994 | Estes | |
| 5,301,416 | 4/1994 | Foerstel | |
| 5,302,921 | 4/1994 | Shigemori et al. | 331/158 X |
| 5,327,104 | 7/1994 | Kikushima | 331/158 X |
| 5,338,971 | 8/1994 | Casati et al. | 257/666 |
| 5,343,072 | 8/1994 | Imai et al. | |
| 5,360,992 | 11/1994 | Lowrey et al. | |
| 5,371,408 | 12/1994 | Moulton et al. | |
| 5,373,188 | 12/1994 | Michii et al. | 257/666 |
| 5,381,037 | 1/1995 | Olivarez | |
| 5,396,032 | 3/1995 | Bonham, Jr. et al. | |
| 5,428,319 | 6/1995 | Marvin et al. | |
| 5,495,125 | 2/1996 | Uemura | 257/666 |

FOREIGN PATENT DOCUMENTS

| | | |
|---|---|---|
| 169941A | 12/1984 | European Pat. Off. |
| 1-293524 | 11/1989 | Japan |
| WO82/04161 | 11/1982 | WIPO |
| WO83/00244 | 1/1983 | WIPO |

*Primary Examiner*—David Mis
*Attorney, Agent, or Firm*—Gary J. Cunningham

[57] ABSTRACT

A function-differentiated temperature compensated crystal oscillator (10) is disclosed having an integrated circuit (12), at least one capacitor (14) and a piezoelectric element (16) being electrically coupled to a leadframe (18), and being encapsulated in a molded package body (36). The leadframe (18) includes two groups of leads (20, 26), each group accessing different functionalities of the temperature compensated crystal oscillator (10). In one application, the first group of leads (20) may be excised preventing user access to internal functions of the oscillator (10). In another application, the second group of leads (26) may be excised allowing user access to the internal functions of the oscillator (10). This configuration enables a single package to be used for different user applications and functions.

5 Claims, 4 Drawing Sheets

FUNCTION-DIFFERENTIATED TEMPERATURE COMPENSATED CRYSTAL OSCILLATOR AND METHOD OF PRODUCING THE SAME

FIELD OF THE INVENTION

The present invention relates generally to frequency control devices and, in particular, to a function-differentiated temperature compensated crystal oscillator and method of producing the same.

BACKGROUND OF THE INVENTION

Frequency control devices are known to include various types of temperature compensated crystal oscillators. A typical quartz temperature compensated crystal oscillator utilizes several components including a piezoelectric element, an integrated circuit, capacitors, inductors, resistors, etc. These frequency control devices are commonly found in electronic communication devices such as cellular phones, pagers, radios and wireless data devices. Typically, each of these electronic communication devices are available in a range of different models to meet consumer demands for different price and performance levels. Generally, electronic communication devices of different performance levels require functional and performance differences in their temperature compensated crystal oscillators. The need has arisen for a temperature compensated crystal oscillator which is multi-functional and more versatile to meet the changing demands of the marketplace in electronic communication devices, without adding cost.

At its most basic level, a temperature compensated crystal oscillator provides a stable frequency output signal when power is applied to temperature compensated crystal oscillator power inputs. Most temperature compensated crystal oscillators also provide some type of frequency adjustment function for the user. This allows the user to fine tune the output frequency to match their particular communication device requirements. Earlier temperature compensated crystal oscillators were frequency adjusted by the use of an internal variable capacitor which was mechanically adjusted. These oscillators had a tendency to drift which required periodic readjustment.

Later temperature compensated crystal oscillator designs used an integrated circuit (IC) to drive the oscillator and control its frequency. These temperature compensated crystal oscillators can be frequency adjusted by the application of an external DC "warp" voltage by the user. In higher performance temperature compensated crystal oscillator applications, the user may be allowed direct access to the IC of the temperature compensated crystal oscillator by the provision of digital signal input/output leads in the temperature compensated crystal oscillator package. This access allows the user complete control of the frequency functions of the temperature compensated crystal oscillator.

Previously, each of the different types of frequency adjustment functionalities, described above, required different temperature compensated crystal oscillators in different packaging. Therefore, as performance requirements of communication devices changed, different temperature compensated crystal oscillators in different packages were required. Temperature compensated crystal oscillators are commonly manufactured in leadless ceramic packages or in leaded thermoset plastic packages. In each type, the basic temperature compensated crystal oscillator package requires four input/output leads or contacts; one for ground, one to supply power, one for the stable frequency output, and one for the user adjustment of output frequency by the application of a DC "warp" voltage. Higher performance temperature compensated crystal oscillators provide additional input/output leads or contacts which allow user access to the integrated circuit functions of the oscillator. These functions may include the voltage regulator, IC memory, and frequency control functions.

In order to lower the cost of leadless ceramic temperature compensated crystal oscillator packaging, it is common to provide as many input/output contacts as would be required for the highest performance oscillator design or application, or at a minimum, the oscillator design requiring the most input/output contacts. In this way, the same package can be used for most, if not all, of a manufacturer's existing temperature compensated crystal oscillator designs. This approach also allows the temperature compensated crystal oscillator manufacturer the option to assemble all of their oscillators to the highest performance design which are then subject to sorting by performance. Those oscillators passing the high performance specifications can be sold as such. Those oscillators failing the high performance test specifications, but passing the low performance test specifications can be sold as such. The assembly techniques improves manufacturers costs, by reducing scrap. However, lower performance oscillators still retain the input/output connections of the higher performance design. Therefore, a user with lower performance requirements may inadvertently connect the oscillator package improperly and unintentionally input signals which may access, erase or change the IC settings of the oscillator to their detriment. This is a situation which, in the user's view, results in a catastrophic failure.

Similarly, a leaded thermoset plastic temperature compensated crystal oscillator package may be used, and it is common to provide as many input/output leads as would be required for the highest performance oscillator design or application, or at a minimum, the oscillator design requiring the most input/output leads. However, the leaded package has some manufacturing advantages over the leadless ceramic package. First, the package is generally cheaper to produce. Second, changing the package leads for different oscillator designs can be done by changing the leadframe used, without changing the package body. Conversely, there are some problems associated with plastic packaging. First, changing leadframes requires changing the assembly process, also. Second, keeping different leadframe increases inventory. The present invention can solve many of these problems by using one package and leadframe for different temperature compensated crystal oscillator designs by the use of multiple and redundant input/output leads which can be trimmed to alter the available functionality for each user.

A significant portion of the cost of a quartz temperature compensated crystal oscillator is in its packaging. These oscillators typically have higher material and labor costs than a similarly packaged IC. Therefore, oscillator scrap costs due to yield losses are to be avoided if at all possible. Cost reduction can be achieved if the packaging for these oscillators can be simplified without sacrificing yield.

There is a need for a more versatile and improved functionality temperature compensated crystal oscillator package and method for making the same, that: is low cost; has high yield; minimizes inventory; reduces scrap; and is readily manufacturable without custom equipment or added costs.

DETAILED DESCRIPTION OF THE PREFERRED EMBODIMENT

The present invention provides a temperature compensated crystal oscillator in a single package which can be configured for functionally different user applications. This can be achieved by excising different combinations of leads on the temperature compensated crystal oscillator package to prevent or permit user access to the internal functions of the temperature compensated crystal oscillator. This has the advantage of eliminating the need to fabricate different temperature compensated crystal oscillator packages for different user applications. In one embodiment, the leads of the temperature compensated crystal oscillator are excised to permit user access to only the power, frequency output and frequency adjustment leads. In another embodiment, the leads of the temperature compensated crystal oscillator are excised so as to permit user additional access to the internal circuitry and the integrated circuit (IC) of the temperature compensated crystal oscillator. In this embodiment, the user is allowed to change the frequency of the temperature compensated crystal oscillator, change the waveshape of the output, modify the temperature performance, divide the frequency, implement a power saver function, directly address the memory, and other functions. Alternatively, the temperature compensated crystal oscillator could be provided with none of the leads excised to allow the greatest flexibility to the user.

Figure 1:
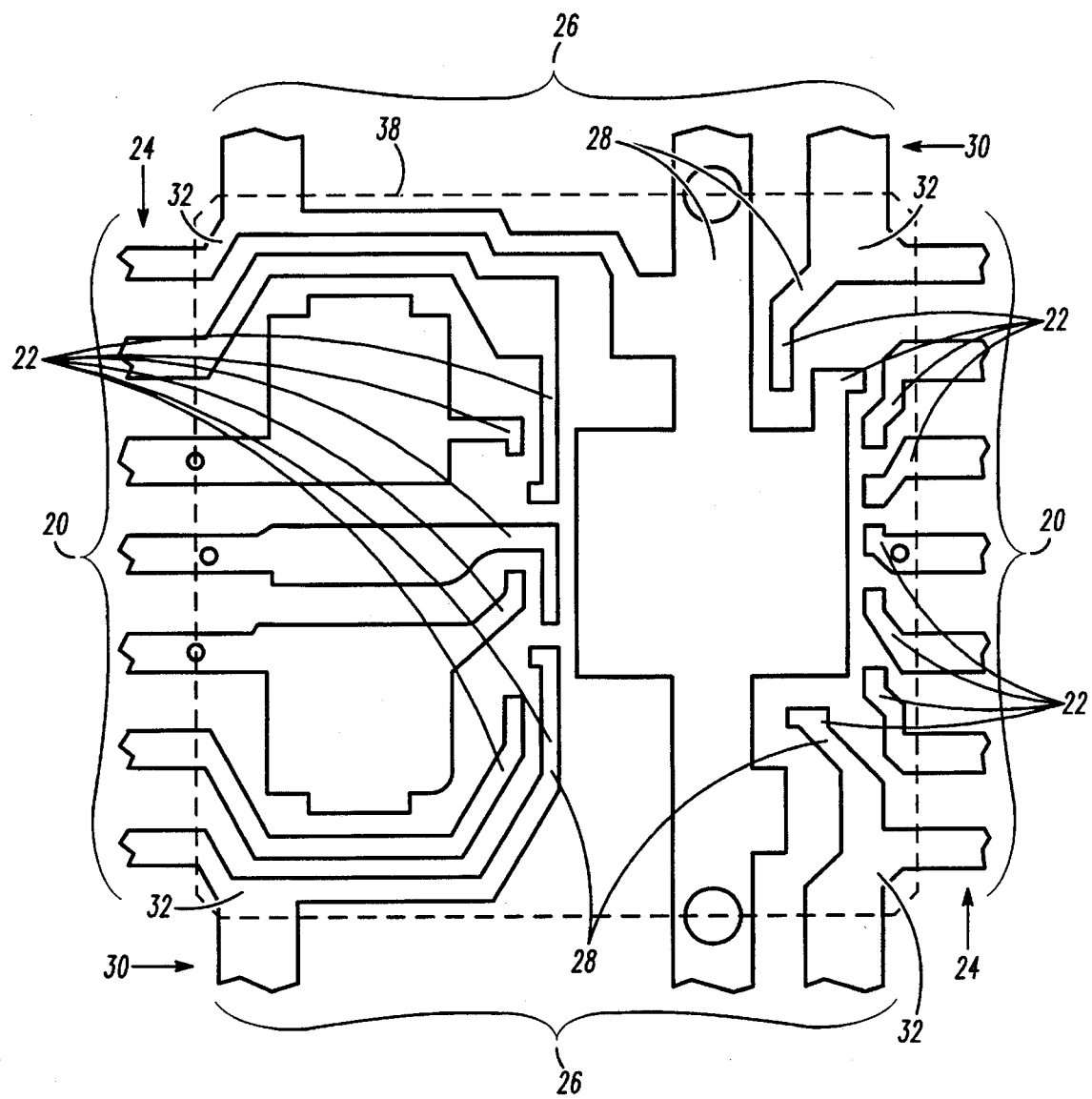
FIG. 1 shows a top view of a center section of a leadframe of a temperature compensated crystal oscillator before assembly and showing an outline of where a periphery of a package body will be located after assembly, in accordance with the present invention.

In FIG. 1, a leadframe 18 for a temperature compensated crystal oscillator 10 is shown. The leadframe 18 includes a first and second plurality of conductive leads 20, 26. It should be recognized that the leadframe can be supplied in a linear or array form. The leadframe 18 may of any conductive material. In a preferred embodiment, the leadframe 18 is comprised of a copper alloy. The first plurality of conductive leads 20 include inner portions 22 to be encapsulated within the oscillator package and outwardly extending outer portions 24. Similarly, the second plurality of conductive leads 26 include inner portions 28 to be encapsulated within the oscillator package and outwardly extending outer portions 30. FIG. 1 shows a superimposed outline indicating a periphery 38 of the oscillator package delineating the inner portions 22, 28 from the outer portions 24, 30 of the first and second pluralities of conductive leads 20, 26.

The leadframe 18 includes at least one of the first plurality of conductive leads 20 having a common electrical connection 32 with at least one of the second plurality of conductive leads 26. In a preferred embodiment, there are four common electrical connections 32 between the first and second pluralities of electrical connections 20, 26. The functions related to these four common leads of the temperature compensated crystal oscillator 10 are typically; power, ground, frequency output and frequency adjust.

Figure 2:
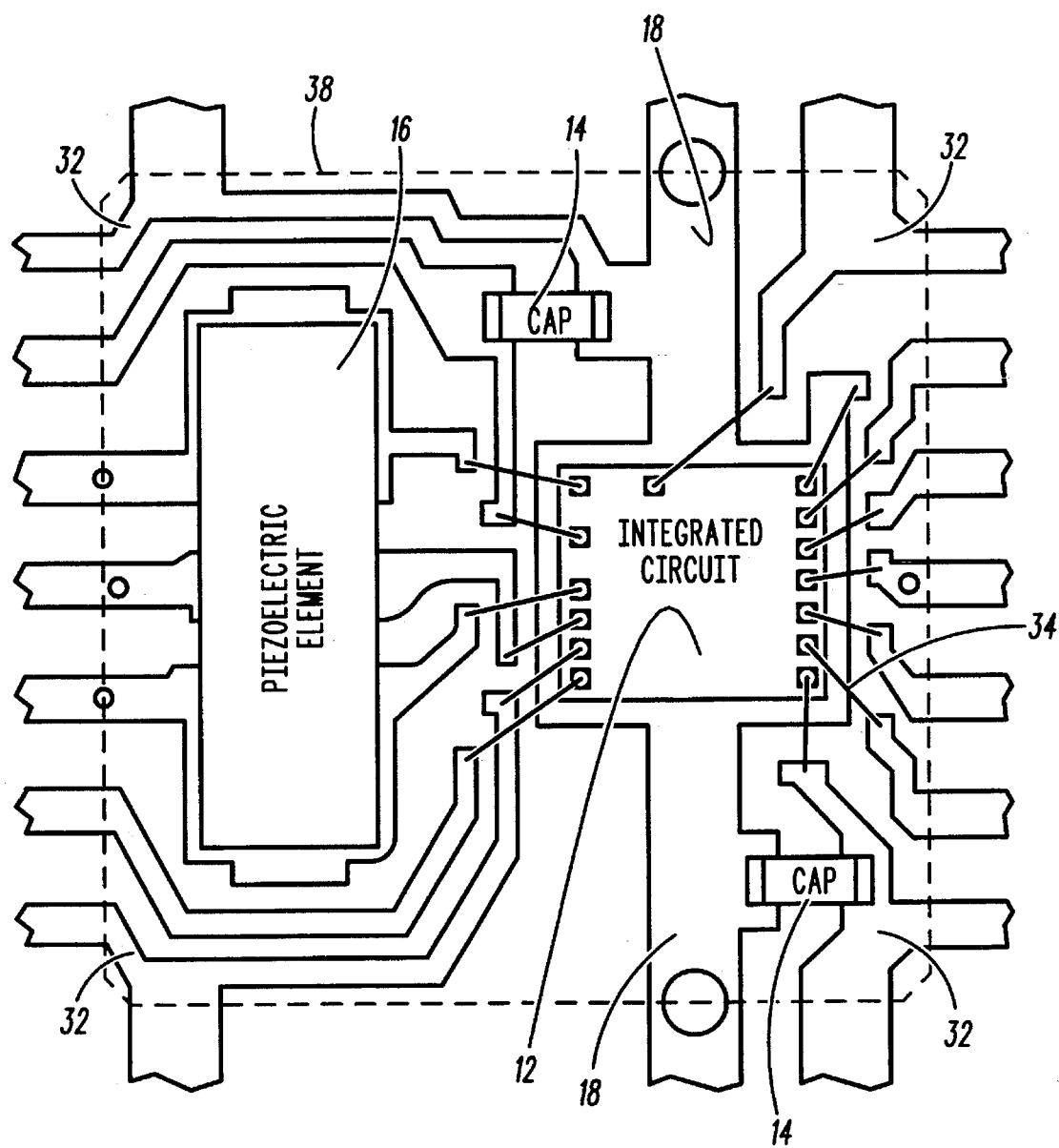
FIG. 2 shows a top view of the center section of the leadframe after attachment and electrical coupling of a piezoelectric element, an integrated circuit and at least one capacitor, in accordance with the present invention.

As shown in FIG. 2, the temperature compensated crystal oscillator 10 includes a leadframe 18, an IC 12, at least one capacitor 14, and a piezoelectric element 16. In a preferred embodiment, the piezoelectric element 16 is a quartz resonator, and the temperature compensated crystal oscillator 10 utilizes two capacitors 14. The capacitors 14 and the piezoelectric element 16 are attached to the leadframe 18 with conductive adhesive so as to electrically couple them to the leadframe 18. More particularly, a conductive epoxy is used. The IC 12 is bonded to the leadframe 18, and further electrically coupled to the inner portions 22, 28 of the first and second pluralities of conductive leads 20, 26 by wirebonds 34, whereby a different oscillator function is available on the second plurality of conductive leads 26 than is available on the first plurality of conductive leads 20. It should be recognized by those skilled in the art that many methods may be used to attach and couple the components to the leadframe 18. The present invention advantageously provides at least one common electrical connection 32 which permits selective excising of leads without sacrificing functionality, whereas in the prior art multiple package solutions were required.

Figure 3:
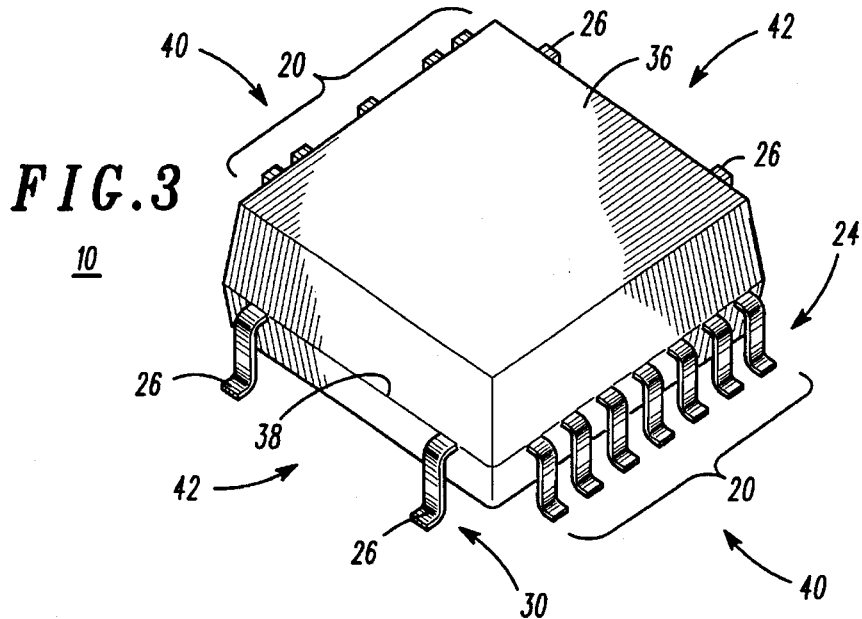
FIG. 3 shows a perspective view of one embodiment of the temperature compensated crystal oscillator after molding. the package body and configuring the leads, in accordance with the present invention.

As shown in FIG. 3, the leadframe 18 and the attached oscillator components 12, 14, 16 (not shown) are encapsulated within a package body 36 of the temperature compensated crystal oscillator 10. In a preferred embodiment, the package body 36 is a thermosetting epoxy resin which has been transfer molded using conventional techniques that are well known in the art of integrated circuit packaging. The package body 36 is formed such that the outer portions 24, 30 of the first and second pluralities of conductive leads 20, 26 extend outwardly from a periphery 38 of the package body 36.

There are many ways in which the lead may be configured to conform with user mounting requirements. This includes; gull-wing, J-leads, through-hole, butt-joint, and the like. It should be recognized that a user may be provided a lead-configured temperature compensated crystal oscillator 10 in this fully-leaded form without further processing.

Each lead of the first and second pluralities of leads 20, 26 may be located anywhere along the periphery 38. However, in a preferred embodiment, the first plurality of leads 20 are located along a first set of opposing sides 40 of the package body 36, and the second plurality of leads 26 are located along a second set of opposing sides 42 of the package body 36. More preferably, the common electrical connections 32 (not shown) are located at corners of the package body 36. This has the advantage of locating leads with common functionality entirely along common opposing sides, which facilitates temperature compensated crystal oscillator 10 function differentiation by subsequent excision of all the leads along either set of opposing sides 40, 42. This arrangement also provides a stable opposing-lead mounting platform for user use.

Figure 4:
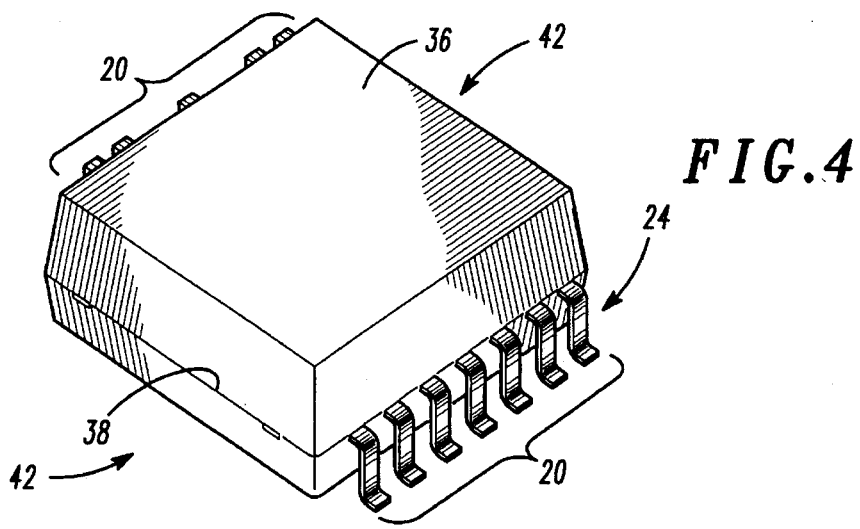
FIG. 4 shows a perspective view of another embodiment of the function-differentiated temperature compensated crystal oscillator after excising the leads to allow the user access to the internal functions of the temperature compensated crystal oscillator, in accordance with the present invention.

In one embodiment of the invention, shown in FIG. 4, all the leads on the second set of opposing sides 42 have been excised so that they terminate substantially flush with the periphery 38 of the package body 36 leaving only the first plurality of leads 20 exposed. The advantage of this embodiment is that the user has external access to the internal functions and the IC of the temperature compensated crystal oscillator 10.

Figure 5:
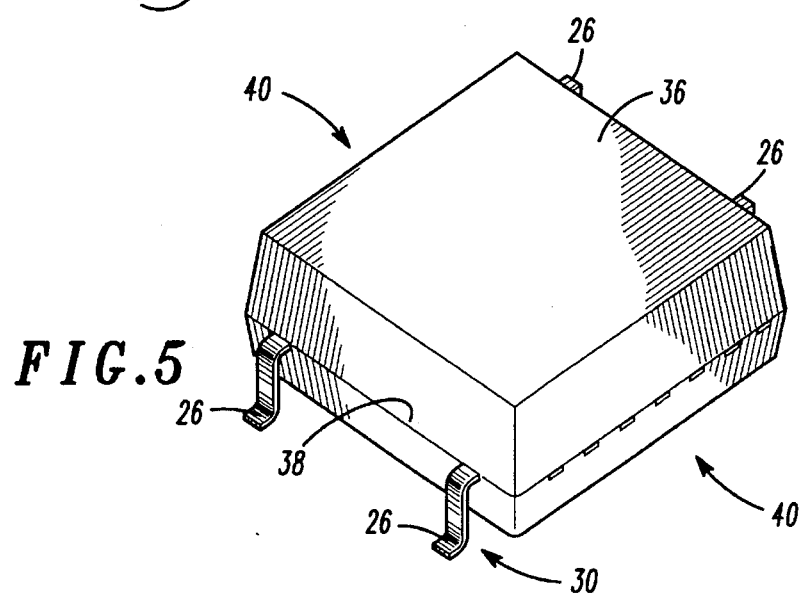
FIG. 5 shows a perspective view of another embodiment of the function-differentiated temperature compensated crystal oscillator after excising the leads to prevent user access to the internal functions of the temperature compensated crystal oscillator, in accordance with the present invention.

In another embodiment of the invention, shown in FIG. 5, all the leads on the first set of opposing sides 40 have been excised so that they terminate substantially flush with the periphery 38 of the package body 36 leaving only the second plurality of leads 26 exposed. The advantage of this embodiment is that the user is substantially prevented from accidentally accessing and changing the functions of the internal circuitry and the IC of the temperature compensated crystal oscillator 10.

Figure 6:
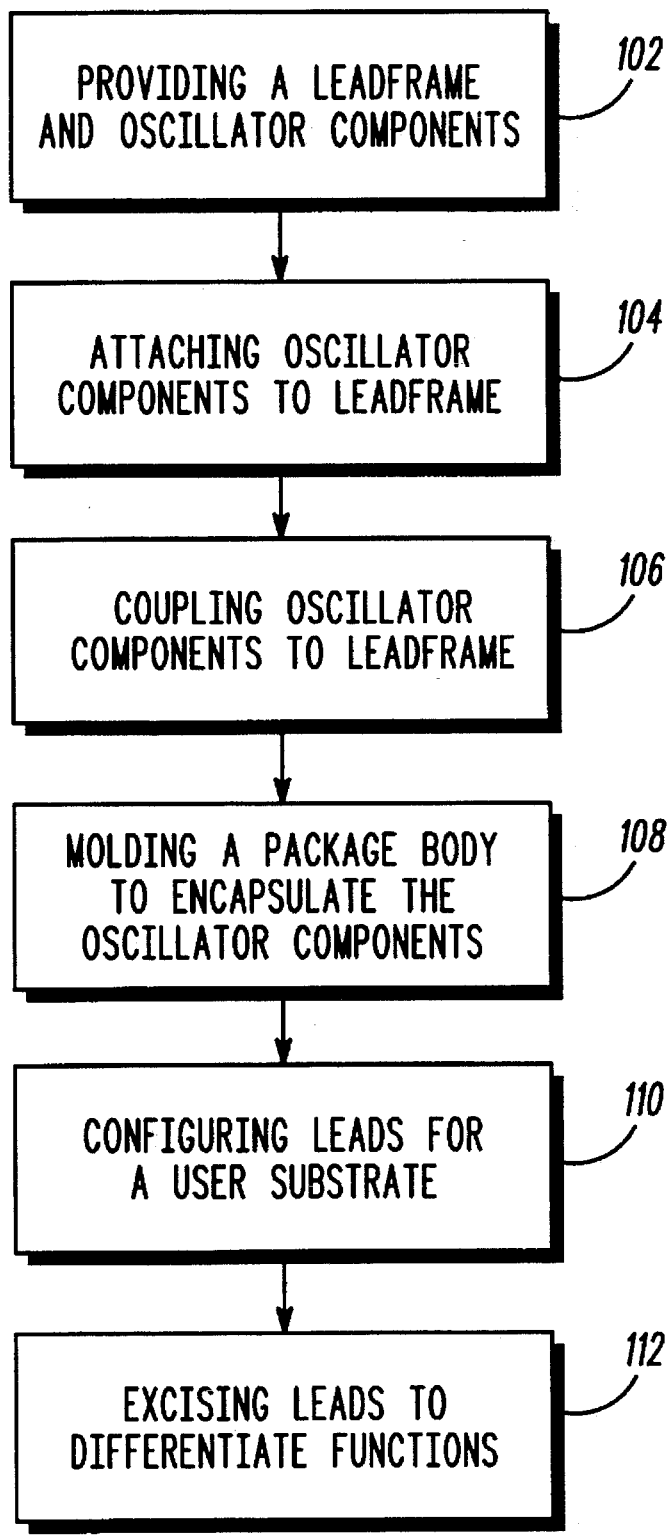
FIG. 6 shows a block diagram for a method of producing the function-differentiated temperature compensated crystal oscillator, in accordance with the present invention.

Referring to FIGS. 2 and 6, a first major step in the processing of the function-differentiated temperature compensated crystal oscillator 100 can include a step of providing 102 an integrated circuit 12, at least one capacitor 14, a piezoelectric element 16, and a leadframe 18. In a preferred embodiment, two capacitors 14 are provided, and the piezoelectric element includes a quartz resonator. The leadframe 18 may be punched or etched from a metal sheet. In a preferred embodiment, the leadframe 18 is punched from a copper alloy sheet.

In a preferred embodiment, the leadframe 12 can be selectively plated, before or after processing, to minimize corrosion, improve wirebonding inside the package and improve solderability outside the package. The leadframe 12 may be plated with a precious metal, preferably such as silver, on the inner portions 22, 28 of the conductive leads, in proximity to and around where the IC 20 is placed, to improve wirebonding. In addition, this embodiment includes the outer portions 24, 30 of the leads being lead-tin plated after processing the temperature compensated crystal oscillator 10 to improve solderability.

A second major step comprises an attaching step 104, which provides attaching oscillator components such as a piezoelectric element 16, at least one capacitor 14 and an IC 12 to the leadframe 18, substantially as shown in FIG. 2. These components may be attached by use of a conductive adhesive selectively dispensed onto the leadframe 18 in predetermined positions for the placement of the oscillator components such as the IC 12, capacitor 14 and piezoelectric element 16. In a preferred embodiment, the conductive adhesive comprises a silver-filled epoxy, such as Amicon C990™ (manufactured by Grace Inc.). However, other suitable conductive adhesives may be used so long as they have the desired properties and characteristics. As should be understood by those skilled in the art, epoxy dispensing can be accomplished manually or automatically.

After the conductive adhesive has been dispensed, the IC 12, capacitors 14 and piezoelectric element 16 are aligned and placed onto the conductive adhesive. As should be understood by those skilled in the art, this process step can be accomplished manually or automatically. In a preferred embodiment, the IC 12, capacitors 14 and piezoelectric element 16 are automatically placed by a Seiko D-Tran XM robotic system (manufactured by Seiko Co. of Japan). After placing the oscillator components the conductive adhesive is cured. The conductive adhesive may be cured in a convection type, air vented oven (such as one manufactured by Blue-M Corp.) at a temperature of about 150° C. for a predetermined time, such as for about 60 minutes to about 90 minutes or until the conductive adhesive is fully cured.

A third major process step is the coupling step 106. The nature of the conductive epoxy used in the attaching step 104 has the advantage of simultaneously providing electrical coupling 106 for the piezoelectric element 16 and the capacitor 14. However, the IC 12 requires separate electrical coupling to the inner portions 22, 28 of the first and second pluralities of conductive leads 20, 26. The IC 12 may be coupled by wirebonds 34, solder or conductive adhesive. In a preferred embodiment, the IC 12 is coupled to the inner portions 22, 28 with wirebonds 34. The wirebond 34 is typically gold or aluminum, and the wirebonding process may use either ball or wedge bonding. In a preferred embodiment, the IC 12 is ball bonded with a gold wirebond 34 of from about 0.5 to about 3 mils in diameter (typically a 1 to 1.5 mil diameter is used). A preferred automated wirebonding system is a K&S 1419 wirebonder system (manufactured by Kulicke and Soffa, Inc. of Pennsylvania).

Referring to FIGS. 3 and 6, a fourth major process step can include the molding 108 of a package body 36 to encapsulate the oscillator components. In a preferred embodiment the molding material is chosen to be thermosetting epoxy resin, and the preferred method of molding is conventional transfer molding technique which is well known in the art. The package body 36 is transfer molded to encapsulate the IC 12, the at least one capacitor 14, the piezoelectric element 16, and the inner portions 20, 28 of the first and second pluralities of conductive leads 20, 26. After molding, the outer portions 24, 30 of the first and second pluralities of conductive leads 20, 26 may be electroplated with lead-tin to prevent corrosion and improve the solderability of the leads 20, 26.

A fifth major process step is a lead configuring step 110. Part of this step includes separation of the temperature compensated crystal oscillator 10 from unwanted portions of the leadframe 18, and configuring the leads 20, 26 for connection to a user substrate. There are many ways in which the leads 20, 26 may be configured to conform with user mounting requirements. FIG. 3 shows an embodiment in the form of a gull-wing lead shape. However, other lead shapes, such as butt-joint, through-hole, J-shaped leads, and the like, may be made. It should be recognized that a user may be provided a lead-configured temperature compensated crystal oscillator 10 in this fully-leaded form directly after lead configuration and without further processing.

After lead configuration, in a preferred embodiment, a further excising step 112 may be provided. The advantage of this step 112 is that a single temperature compensated crystal oscillator package can be configured for functionally different user applications. This is achieved by excising different combinations of leads on the temperature compensated crystal oscillator package to prevent or permit user access to the internal functions of the temperature compensated crystal oscillator 10. This has the advantage of eliminating the need to fabricate different temperature compensated crystal oscillator packages for different user applications.

In one embodiment, as shown in FIG. 4, the outer portions 24 of the first plurality of conductive leads 20 are excised to be substantially flush with the first set of opposing sides 40 of the periphery 38 of the package body 36. The advantage of this is that user access to the internal functions and IC 12 of the temperature compensated crystal oscillator 10 is substantially prevented, and only the most basic functions of the oscillator are accessible through the second plurality of conductive leads 26.

In another embodiment, as shown in FIG. 5, the outer portions 30 of the second plurality of conductive leads 26 are excised to be substantially flush with the second set of opposing sides 42 of the periphery 38 of the package body 36. The advantage of this is that a user is permitted access to the internal functions and IC 12 of the temperature compensated crystal oscillator 10 substantially through the first plurality of leads.

Although various embodiments of this invention have been shown and described, it should be understood that various modifications and substitutions, as well as rearrangements and combinations of the preceding embodiments, can be made by those skilled in the art, without departing from novel spirit and scope of this invention.

What is claimed is:

1. A function-differentiated temperature compensated crystal oscillator, comprising:

an integrated circuit, at least one capacitor, a piezoelectric element, a leadframe and a package body having a periphery including a first and a second set of opposing sides;

the leadframe having a first and a second plurality of conductive leads each having inner and outer portions, the conductive leads configured for connection to a user substrate;

the integrated circuit, the at least one capacitor and the piezoelectric element being attached to the leadframe and electrically coupled to the first and second pluralities of conductive leads, whereby at least one different oscillator function is available on the first plurality of conductive leads than is available on the second plurality of conductive leads;

the package body encapsulating the integrated circuit, the at least one capacitor, the piezoelectric element and the inner portions of the first and second pluralities of conductive leads, at least one of the outer portions of the first plurality of conductive leads extending outwardly from the first set of opposing sides and the outer portions of the second plurality of conductive leads extending outwardly from the second set of opposing sides; and at least one of (i) the first plurality of conductive leads being excised to terminate substantially flush with the first set of opposing sides of the periphery of the package body leaving only the second plurality of conductive leads providing contacts for ground, power, a stable frequency output and output frequency adjust exposed on the second set of opposing sides, whereby external access to the internal functions of the temperature compensated crystal oscillator through the first plurality of conductive leads is substantially minimized, and (ii) the second plurality of conductive leads being excised to terminate substantially flush with the second set of opposing sides of the periphery of the package body leaving only the first plurality of conductive leads providing contacts for ground, power, a stable frequency output and output frequency adjust exposed on the first set of opposing sides, to provide user access to at least one integrated circuit function through the first plurality of leads.

2. The temperature compensated crystal oscillator of claim 1, wherein the conductive leads have a configuration selected from the group consisting of gull-wing, J-leads, through-hole, and butt-joint.

3. The temperature compensated crystal oscillator of claim 1, wherein the package body is molded.

4. A method of making a function-differentiated temperature compensated crystal oscillator, comprising:

providing an integrated circuit, at least one capacitor, a piezoelectric element and a leadframe having a first and a second plurality of conductive leads each having inner and outer portions;

attaching the integrated circuit, the at least one capacitor and the piezoelectric element to the leadframe;

electrically coupling the integrated circuit, the at least one capacitor and the piezoelectric element to the inner portions of the first and second pluralities of conductive leads, whereby a different oscillator function is available on the second plurality of conductive leads than is available on the first plurality of conductive leads;

molding a package body so as to encapsulate the integrated circuit, the at least one capacitor, the piezoelectric element and the inner portions of the first and second pluralities of the conductive leads, the package body having a periphery including a first and a second set of opposing sides having the outer portions of first plurality of conductive leads extending outwardly from the first set of opposing sides and the outer portions of the second plurality of conductive leads extending outwardly from the second set of opposing sides;

configuring the outer portions of the first and second pluralities of conductive leads for connection to a user substrate; and excising at least one of (i) the outer portions of the first plurality of conductive leads to be substantially flush with the first set of opposing sides of the periphery of the package body leaving only the second plurality of conductive leads exposed on the second set of opposing sides to provide user access to at least one integrated circuit function through the second plurality of leads, whereby external access to the internal functions of the temperature compensated crystal oscillator through the first plurality of conductive leads is substantially minimized, and (ii) the outer portions of the second plurality of conductive leads to be substantially flush with the second set of opposing sides of the periphery of the package body leaving only the first plurality of conductive leads exposed on the first set of opposing sides, to provide user access to at least one integrated circuit function through the first plurality of leads, whereby external access to the internal functions of the temperature compensated crystal oscillator through the second plurality of conductive leads is substantially minimized.

5. The method of claim 4, wherein the configuring step includes forming the conductive leads to have a configuration selected from the group consisting of gull-wing, J-leads, through-hole, and butt-joint.

* * * * *